(12) United States Patent
Yoo

(10) Patent No.: US 6,252,808 B1
(45) Date of Patent: *Jun. 26, 2001

(54) SEMICONDUCTOR MEMORY DEVICE HAVING IMPROVED ROW REDUNDANCY SCHEME AND METHOD FOR CURING DEFECTIVE CELL

(75) Inventor: Jei-hwan Yoo, Kyungki-do (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,712

(22) Filed: Dec. 31, 1997

(30) Foreign Application Priority Data

Dec. 31, 1996 (KR) .................................. 96-80105

(51) Int. Cl.[7] ........................................... G11C 7/00
(52) U.S. Cl. ............... 365/200; 365/225.7; 365/230.03; 365/230.06
(58) Field of Search ............................... 365/200, 230.03, 365/230.06, 225.7

(56) References Cited

U.S. PATENT DOCUMENTS 5,469,388 * 11/1995 Park ...................... 365/200
5,576,633   11/1996 Rountree et al. ............ 326/10
5,933,382 *  8/1999 Yi et al. .............. 365/200 X

FOREIGN PATENT DOCUMENTS 0095721   12/1983  (EP).
WO 9321578  10/1993  (WO).

* cited by examiner

Primary Examiner—A. Zarabian
(74) Attorney, Agent, or Firm—Marger Johnson & McCollom, P.C.

(57) ABSTRACT

A semiconductor memory device having a row redundancy scheme in which the time to enable a word line during a normal path is less than that of a conventional device, to enhance the operation speed of a memory chip, and the number of common redundancies are maximized to enhance the redundancy capability, and a method for curing a defective cell. The semiconductor memory device has a plurality of global blocks, each of which includes a plurality of unit matrixes having a normal block and a redundancy block, a normal division word line driver, a redundancy division word line driver, a main decoder and an auxiliary decoder. In the main decoder, an output signal is selectively activated according to a row address signal regardless of using the redundancy cell. Also, in the auxiliary decoder, when a corresponding global block is selected according to the row address signal for selecting a global block in a normal operation mode or a redundancy scheme of the corresponding block is used in the redundancy operation mode, an output signal is selectively activated according to the row address signal.

14 Claims, 9 Drawing Sheets

SEMICONDUCTOR MEMORY DEVICE HAVING IMPROVED ROW REDUNDANCY SCHEME AND METHOD FOR CURING DEFECTIVE CELL

BACKGROUND OF THE INVENTION

1. Field of the Invention

The present invention relates to a semiconductor memory device, and more particularly, to a semiconductor memory device having a row redundancy scheme and a method for curing a defective cell.

2. Description of the Related Art

In a general semiconductor memory device with many memory cells, when a memory cell is defective either in manufacturing or later, the memory chip malfunctions and therefore cannot be used. Each memory device is therefore equipped with a curing mechanism which is based upon a redundancy scheme.

Also, as semiconductor memory device technology improves, a greater number of cells are being arranged on a single chip and large integrated circuits are being fabricated. Accordingly, the chance of a defective memory cell in a chip is increasing, and therefore the need for curing of a defective cell in a highly integrated memory is more important than ever for providing a higher yield of the chip.

To avoid defective memory cells from causing the memory chip to malfunction, in a conventional semiconductor memory device, the redundancy scheme includes providing redundancy memory cells as well as basic memory cells. In volatile memory, these redundancy cells are charged in an on-going basis in the same manner as the basic memory cells when and in the event that the redundancy memory cells are used to replace the defective normal memory cells so as to maintain normal operation of the memory device. A circuit called a fuse box is used to replace a defective memory cell with a redundancy memory cell. For greater redundancy, the number of redundancy memory cells and fuse boxes are increased, or several memory cell blocks share a predetermined number of redundancy memory cells and fuse boxes.

FIG. 1 is a block diagram of a memory device having a conventional row redundancy scheme. Here, several memory cell blocks share redundancy cells and fuse boxes. Referring to FIG. 1, the conventional memory device has a row redundancy scheme which includes a precharger 110, a plurality of global memory cell array blocks 100 and a redundancy enabling portion 120.

In particular, the conventional memory device includes a delay unit (which is part of block selector 160) which operates to suspend normal decoder operations during a redundancy mode operation by redundancy enabling portion 120. Below is a description of how the redundancy scheme operates in a convention memory device. As will be discussed below, a conventional redundancy scheme has the disadvantage that during the suspension of coding redundancy operations, the main memory is slowed down.

In the precharger 110, when a "low" or "high" signal is input into a predetermined row address, a low precharge signal RPS is activated. The redundancy enable portion 120 is precharged by the RPS, and responds to a redundancy signal REDi (I=0, 1, . . . , n), which is an output signal of respective global memory cell array blocks 100. Accordingly, when a row redundancy scheme of a global memory cell array block is selected and operated, a row redundancy enable signal RREB becomes activated.

The global memory cell array block 100 is includes a normal block 130, a redundancy block 140, a fuse box 100a, a redundancy driver 150, a block selector 160, a normal word line enabling portion 100b and a normal decoder 100c. The normal block 130 includes many memory cells arranged in rows and column. The redundancy block 140 also includes many memory cells arranged in rows and column, and is selected and operated if a cell in the normal block 130 is defective.

FIG. 2 shows the fuse box 100a in greater detail. The fuse box 100a responds to the RPS signal to be precharged and generates the redundancy signals REDi (I=0, 1, . . . , n) responding to all row address signals of RAi (I=0, 1, . . . , n-1). When the address of a memory cell which normally operates in the normal block is selected, a logic state of the redundancy signal REDi (I=0, 1, . . . , n) goes to "LOW". However, when the address of a defective cell of the normal block is selected, a fuse of a corresponding address shorts. Accordingly, in the second case, a logic state of the redundancy signal REDi (I=0, 1, . . . , n-1) is kept "HIGH" and the redundancy scheme is used.

The normal word line enabling portion 100b is shown in FIG. 3. Here, the normal operation mode, the redundancy signal REDi is "LOW" and a block select signal BLSi of the selected global memory cell array block is "HIGH". Accordingly, a normal word line enable signal NWE output from the normal wordline enable portion 100b goes to "HIGH", to enable the normal word line.

The normal decoder 100c is shown in FIG. 4. During an initial operation, as shown in FIG. 4, the normal decoder 100c is precharged by the RPS. Also, when the NWE is "HIGH", the normal decoder responds to the row address signal RAi (I=0, 1, . . . , n-1), to enable a word line WLij of a corresponding memory cell of the normal block 130.

However, as discussed above, the block selector 160 for generating the block select signal BLSi includes a delay unit. Since operation of the normal coder during a redundancy would cause a malfunction the delay unit prevents such operation.

Accordingly, in the conventional memory device having a row redundancy scheme, the NWE operates the normal decoder, through a delay path of REDi-RREB-BLSi-NWE, and further a delay unit is included in the block selector 160. As a result, the enabling of a word line is disadvantageously delayed even in a normal path. Also, since a defective cell is always replaced with a redundancy cell from the same global block, the efficiency is low.

SUMMARY OF THE INVENTION

Objects of this invention include providing a semiconductor memory device having a redundancy scheme in which the time to enable a word line in a normal path is less than that of a conventional device, enhancing the operation speed of a memory chip, and maximizing the number of common redundancies to enhance the redundancy capability. (Common redundancies refer to the fact that a redundancy block can replace normal columns in multiple memory blocks, and thus is common to those memory blocks.)

It is another object of the present invention to provide a method for curing a defective cell.

To accomplish the above objects of the present invention, this invention provides a semiconductor memory device which allows both to a redundancy block substantially without interruption of normal cell block operations.

More particularly, this invention includes a plurality of global blocks, each of which including a plurality of unit matrixes having of a normal block formed by array of normal cells and a redundancy block formed by array of redundancy cells. The global block includes a normal division word line driver for driving the word line of the normal cells. The global block also includes a redundancy division word line driver for driving the word line of the redundancy cells. The global block further includes a main decoder for supplying an output signal to the normal division word line driver. In particular, the global block of this invention includes an auxiliary decoder for supplying an output signal to both the normal division word line driver and the redundancy division word line driver.

In the main decoder, an output signal is selectively activated according to a row address signal regardless of using the redundancy cell. Also, in the auxiliary decoder, when a corresponding global block is selected according to the row address signal for selecting a global block in a normal operation mode or a redundancy scheme of the corresponding block is used in the redundancy operation mode, an output signal is selectively activated according to the row address signal.

To further accomplish objects of the present invention, there is provided a method for curing a defective cell of a semiconductor memory device using a plurality of global blocks each comprising two or more unit matrixes including a normal block and a redundancy block, a main decoder, and a fuse box. The method for curing a defective cell includes the steps of selectively activating an output signal of the main decoder according to a row address signal regardless of using a redundancy cell of the redundancy block, and using the fuse box of another or different block to which the defective cell during curing is not being used.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
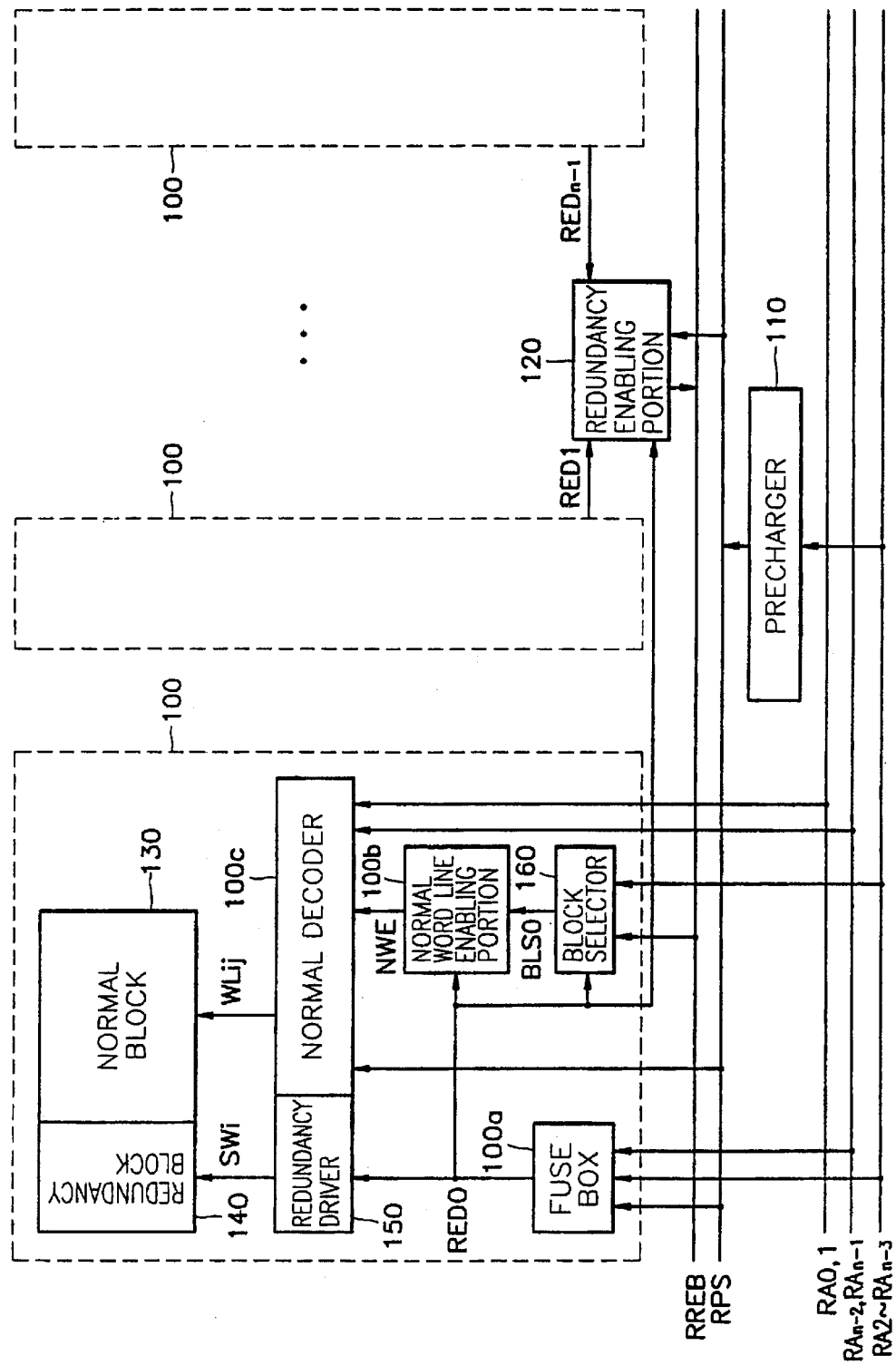
FIG. 1 is a block diagram of a memory device having a conventional row redundancy scheme.
Figure 2:
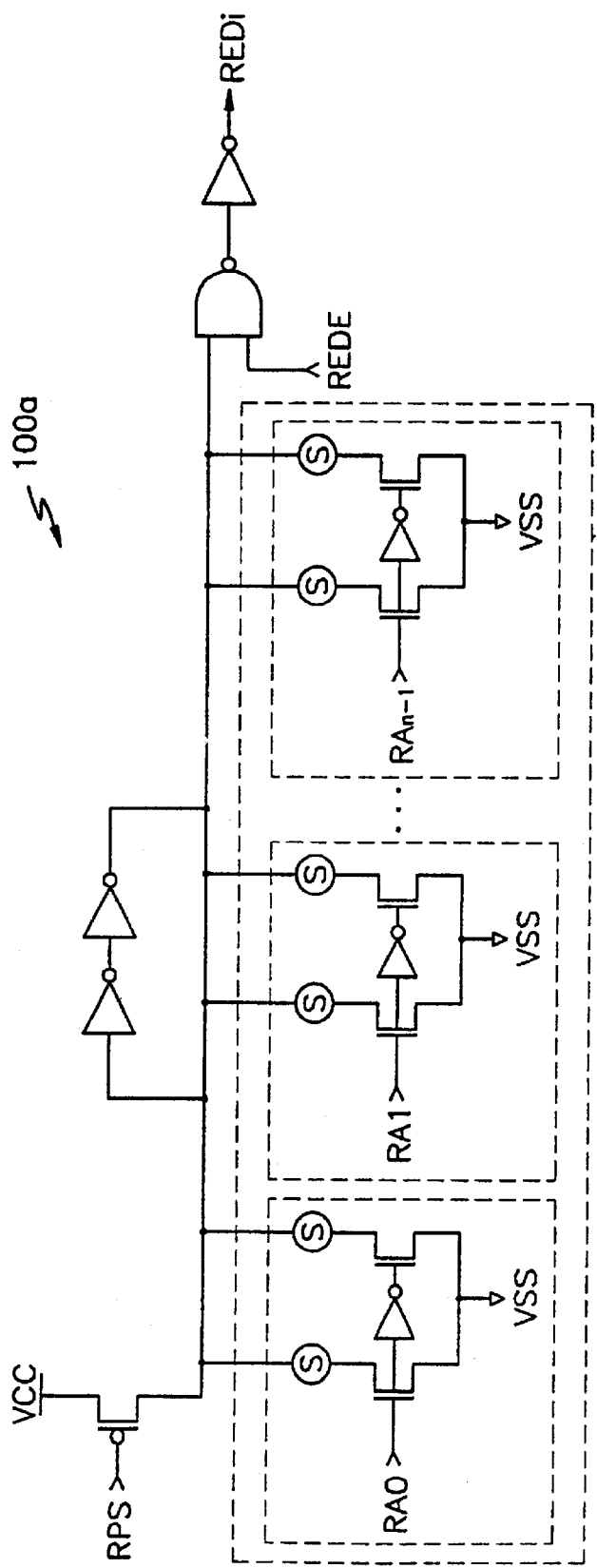
FIG. 2 is a circuit diagram showing a fuse box of the memory device shown in FIG. 1.
Figure 3:
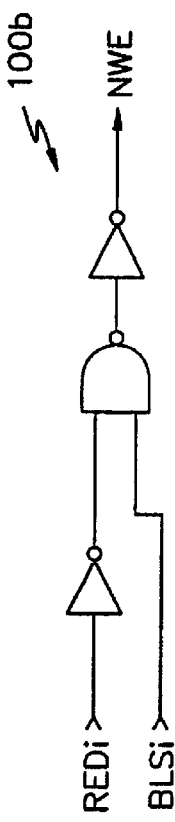
FIG. 3 is a circuit diagram showing a normal word line enabling portion of the memory device shown in FIG. 1.
Figure 4:
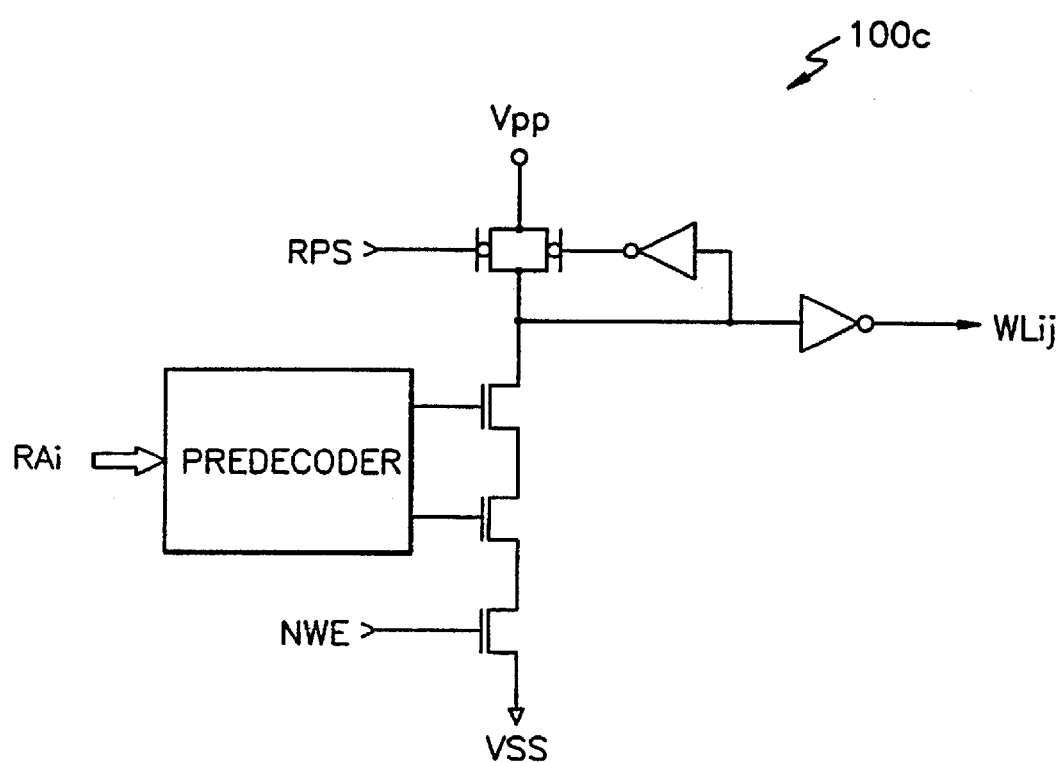
FIG. 4 is a diagram showing a normal decoder of the memory device shown in FIG. 1.

As will be discussed in detail below, a row redundancy scheme according to the present invention, in the case that a memory cell of the redundancy block is used, fuses of other blocks except a global block including a defective cell are short. Accordingly, in the main decoder (see 502 below) including the shorted fuse, the output signal NWij is not enabled by row address decoding. However, in the case of the redundancy driver (see 550 below), a redundancy signal REDi of a corresponding address to the short fuse is enabled. Also, the auxiliary decoder (see 503 below) is also enabled by the redundancy signal REDi, to selectively enable the output signal PKik of the auxiliary decoder according to the row address signal. Accordingly, in the global block where the fuse is short, the redundancy scheme is operated.

Also, in order to prevent the main decoder 502 and redundancy driver 550 from being simultaneously enabled, fuses of the other global memory cell array block should be cut off, during curing the memory cell having a defective cell.

The main decoder 502 is decoded only by the row address signal, regardless of the logic state, i.e., enabling the block select signal BLSi.

Accordingly, a word line enable speed of the normal mode can be greatly enhanced. Also, the normal division word line drivers 504_1, 504_2, . . . can be driven by enabling the output NWij of the main decoder 502 much earlier than the output PXik of the auxiliary decoder 503. The enable time point of the wordline is determined according to the Nwij signal, so that as the NWij is enabled earlier, the wordline is enabled earlier.

According to the memory device having a row redundancy scheme of the present invention, the time for enabling the word line of a normal path in a normal operation mode is earlier, to thereby increase an operation speed of a memory chip.

Also, the redundancy effect is enhanced by using a redundancy scheme of a global block which does not include a defective cell.

General Circuit Configuration

Figure 5:
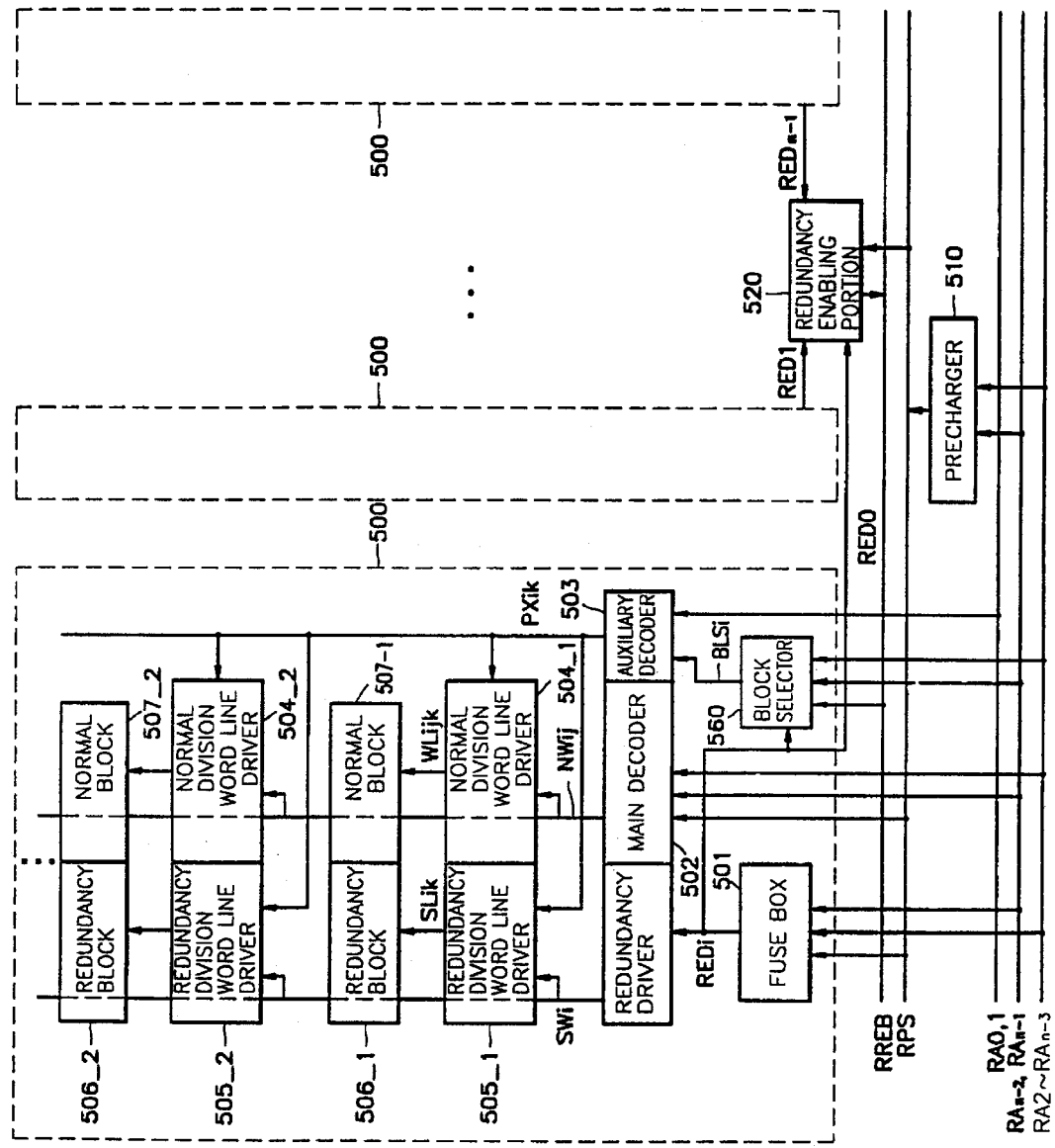
FIG. 5 is a block diagram showing an embodiment of a memory device having a row redundancy scheme according to the present invention.

Referring to FIG. 5, a memory device according to the present invention includes a precharge portion 510, a redundancy enabling portion 520 and a plurality of global memory cell array blocks 500.

The global memory cell array block 500 includes normal blocks 507_1, 507_2, . . . , redundancy blocks 506_1, 506_2, . . . , a fuse box 501, a redundancy driver 550, a block selector 560, a main decoder 502, an auxiliary decoder 503, normal division word line drivers 504_1, 504_2, . . . , and redundancy division word line drivers 505_1, 505_2, . . . , etc.

The normal blocks 507_1, 507_2, . . . include a number of memory cells in rows and columns. The redundancy blocks 506_1, 506_2, . . . include a number of memory cells arranged in rows and columns and are selectively operated when there is damage in a memory cell array of the normal blocks 507_1, 507_2 . . . , etc.

Fuse Box

Figure 6:
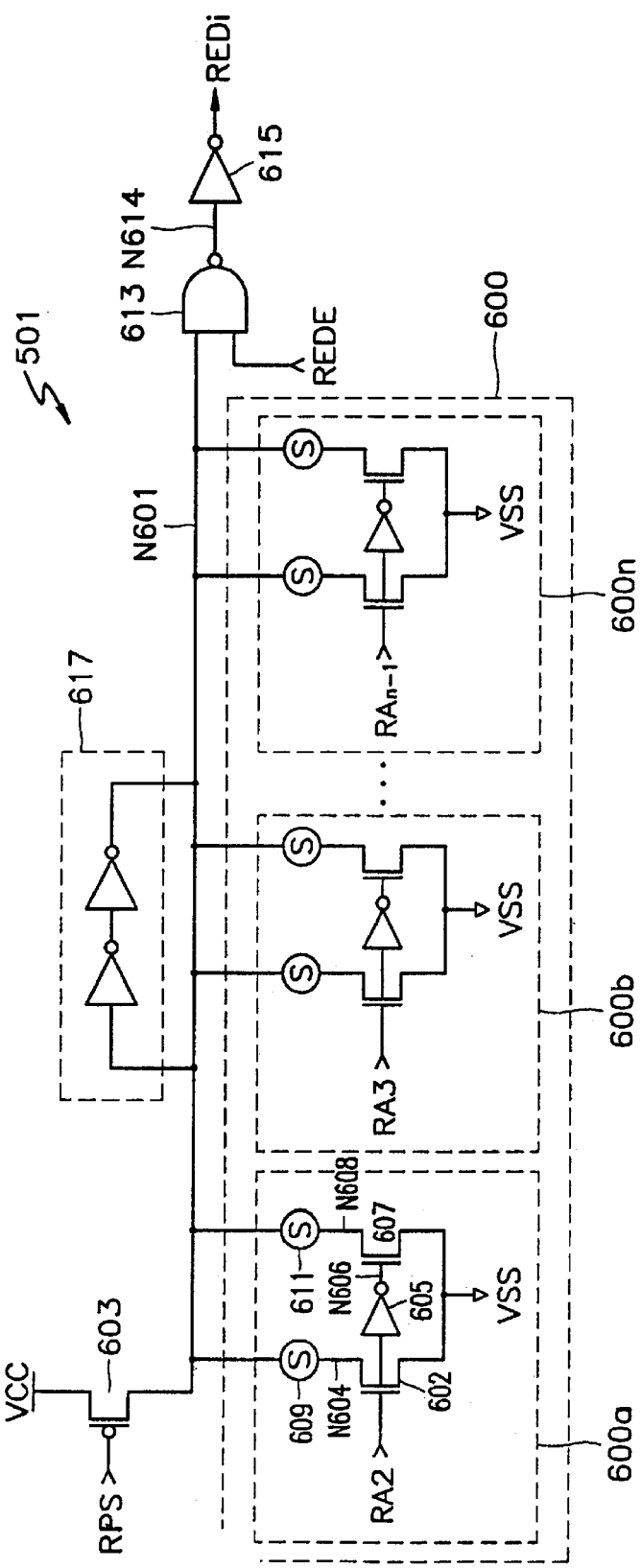
FIG. 6 is a circuit diagram showing a fuse box of the memory device shown in FIG. 5.

Referring to FIG. 6, the fuse box 501 responds to an output signal RPS of the precharge 510 to be precharged.

The fuse box 501 responds to a row address signal $RA_2$~$RA_{n-1}$ for decoding the main decoder 502, to generate a redundancy signal REDi. Thus, to cure a defective cell, the fuse in a different memory block must be shorted or cut. If the corresponding fuse in a specific memory block is not cut, the auxiliary decoder provides decoding for normal cells. However, if the corresponding fuse is cut, the auxiliary decoder provides decoding for the redundancy cells.

The fuse box 501 includes an address sensing circuit 600, a PMOS transistor 603, a latch portion 617, a NAND gate 613, and an inverter 615. The RPS goes to "LOW" during an initial operation of a memory chip, causing PMOS transistor 603 to precharge an address sensing terminal N601 to logic "HIGH". The address sensing circuit 600 includes a plurality of address sensors 600a, 600b, . . . , 600n. The address sensors 600a, 600b, . . . , 600n each include a first NMOS transistor 602, an inversion unit 605, a second NMOS transistor 607, a first fuse 609 and a second fuse 611. In the case that the first and second fuses 609 and 611 do not short in a normal operation mode, i.e., in a fuse box of a corresponding global box, the first and second NMOS transistors 602 and 607 are turned on according to a logic state of the predetermined address signal.

Accordingly, when the address signal is enabled, the voltage of the sensing terminal N601 is decreased, to keep the REDi in a "LOW" state. Also, the REDi is disactivated.

However, in the case that a memory cell of a normal block 507_1, 507_2, . . . , corresponding to a predetermined address is defective, a fuse corresponding to the predetermined address short. Accordingly, even though a predetermined address signal is input, the sensing terminal N601 is preserved as "HIGH" state. As a result, when the REDE signal goes to "HIGH", the output signal REDi of the fuse box goes to "HIGH", to activate the redundancy operation.

The fuse box further includes a latch portion 617 for latching the sensing terminal N601.

Redundancy Driver

Figure 7:
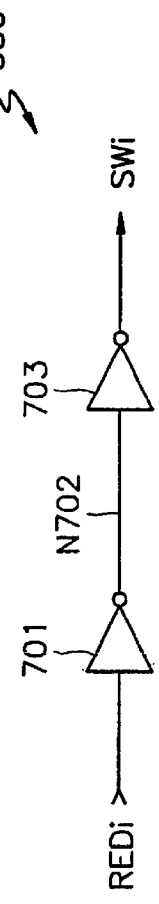
FIG. 7 is a circuit diagram showing a redundancy driver of the memory device shown in FIG. 5.

The redundancy driver 550, as shown in FIG. 7, includes first and second inversion units 701 and 703. The first inversion unit 701 inverts the redundancy signal REDi. The output N702 of the first inversion unit 701 is inverted, to enable a word line of a memory cell of a redundancy block 506_1, 506_2 . . . . , etc.

Accordingly, when the REDi signal goes to "HIGH", the output SWi thereof goes to "HIGH", to enable the word line of the memory cell of the redundancy block 506_1, 506_2, . . . . , etc.

Block Selector

Figure 8:
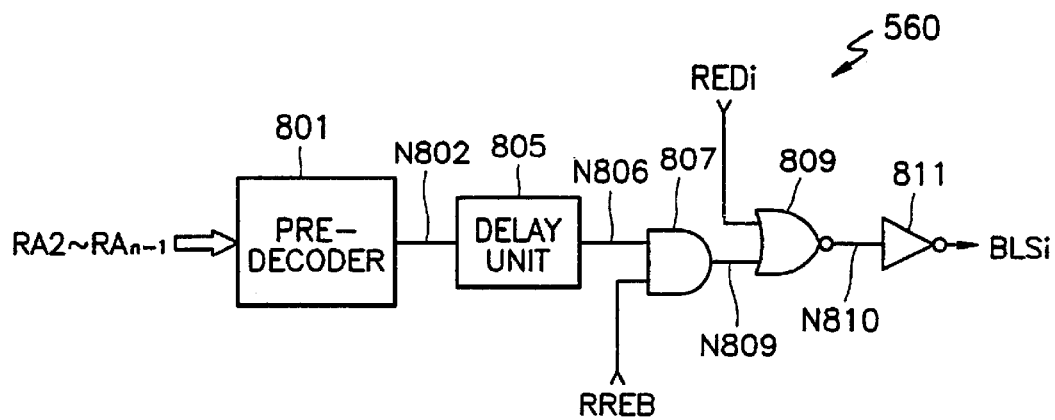
FIG. 8 is a diagram showing a block selector of the memory device shown in FIG. 5.

FIG. 8, shows the block selector 560 which includes a first predecoder 801, a delay unit 805, an AND unit 807, a NOR gate 809 and an inverter 811. The predecoder 801 decodes row address signals $RA_2$~$RA_{n-1}$. Some of the row address signals $RA_2$~$RA_{n-1}$ can be input in to block selector 560 and decided by the predecoder 801. The delay unit 805 delays output signals of the predecoder 801.

Figure 9:
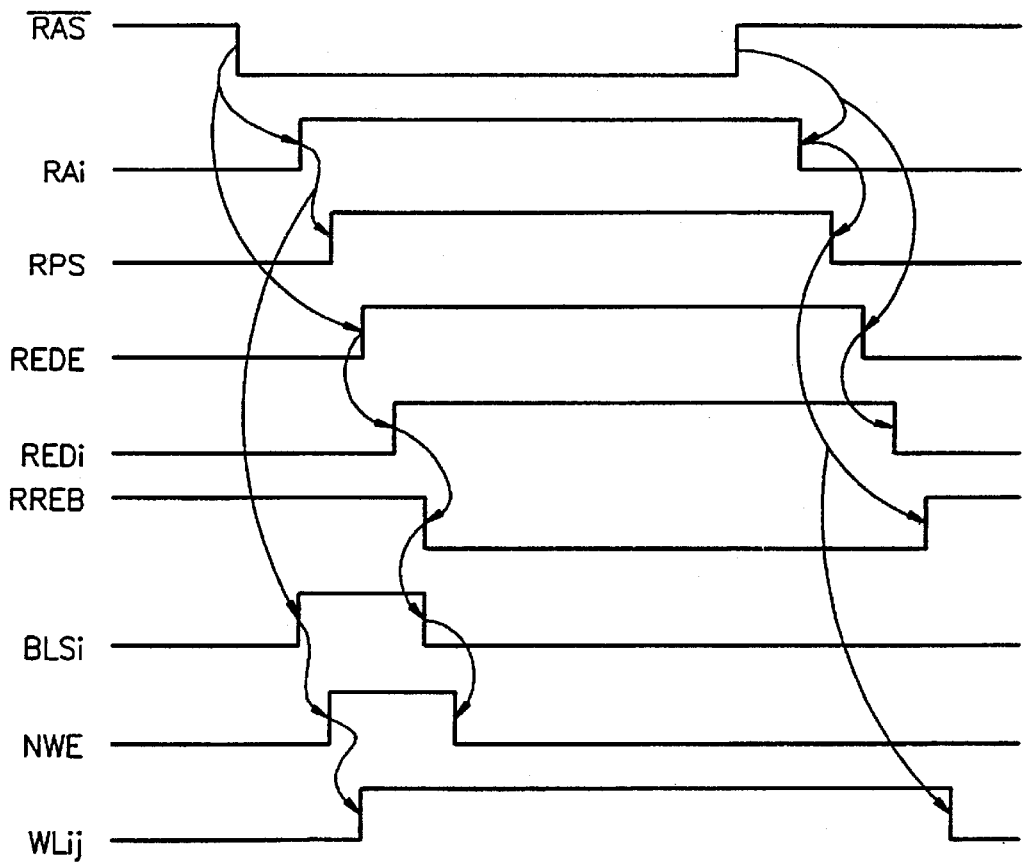
FIG. 9 is a timing diagram of signals of the block selector of FIG. 8 with no delay units.

In the block selector, row address signals $RA_2$~$RA_{n-1}$, the REDi(I=0, 1, . . . , n-1) and a row redundancy enable signal RREB are input signals. Accordingly, in the case that the REDi is in enable state or the output N802 of the predecoder 801 goes to "HIGH" in "High" of the RREB signal, the BLSi is enabled by "HIGH". However, if the block selector had no delay unit 805, in the redundancy operation mode, a "glitch" would be generated. This is a phenomenon in which BLSi, which should be in a disable state, is momentarily enabled. This is because the time for enabling the RREB to "LOW" is later than that of the predecoded row address signal $RA_2$~$RA_{n-1}$, as shown in FIG. 9. This causes the auxiliary decoder 700c of FIG. 5 to operate.

In the AND gate 807, the output N806 of the delay unit 805 and the row redundancy enable signal RREB are AND-operated. The NOR gate 809 NOR-operates the output N809 of the AND gate 807 and the redundancy signal REDi which is an output signal of the fuse box 500a. In the inverter 811, the output N810 of the NOR gate 809 is inverted, to generate the output BLSi.

Accordingly, in the block selector 560 of the memory device having the row redundancy scheme according to the present invention, when the redundancy signal REDi which is an output signal of the fuse box 501 of a corresponding global memory cell array 30 block is "HIGH", the BLSi goes to "HIGH". In the case that a row address is input which causes the output N806 of the delay unit 805 to be "HIGH", and the row redundancy enable signal RREB is disactivated by "HIGH", the BLSi goes to "HIGH".

In the case that the redundancy signal REDi is "LOW" and the output N806 of the delay unit 805 is "LOW", the BLSi goes to "LOW". In the case that the redundancy signal REDi is "LOW" and the row redundancy enable signal RREB becomes "LOW, the BLSi becomes "LOW".

Main Decoder

Figure 10:
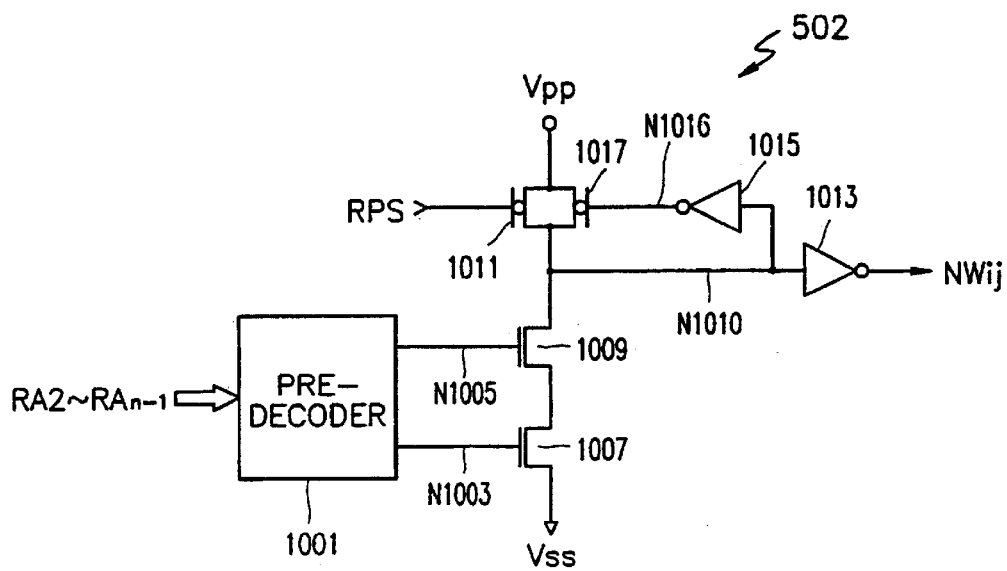
FIG. 10 is a diagram showing a main decoder of the memory device shown in FIG. 5.

Referring to FIG. 10, the main decoder 502 refuses the redundancy signal REDi and is decoded by row address signals $RA_2$~$RA_{n-1}$, to activate an output signal NWij thereof. In detail, the main decoder 502 according to the present invention includes a predecoder 1001, a first NMOS transistor 1007, a second NMOS transistor 1009, a first PMOS transistor 1011 and a first inversion unit 1013.

The predecoder 1001 decodes row address signals $RA_2$~$RA_{n-1}$, to generate first and second outputs N1003 and N1005, respectively. The first NMOS transistor 1007 includes a source connected to a ground voltage VSS, and a gate connected to the first output N1003 of the predecoder 1001. The second NMOS transistor 1009 includes a source connected to a drain of the first NMOS transistor 1007 and a gate connected to the second output N1005 of the predecoder 1001.

The first PMOS transistor 1011 includes a source connected to a predetermined boosted voltage VPP, a gate connected to the row precharge signal RPS, and a drain connected to a drain of the second NMOS transistor 1009, to form a common connection line N1010. The first inversion unit 1013 inverts signals of the common connection line N1010 and outputs the main decoding signal NWij.

Accordingly, when the first and second outputs N1003 and N1005 of the predecoder 1001 go to "HIGH", the N10101 is enables to "HIGH". When the row precharge signal RPS is enabled by "LOW", the common connection line N1010 is precharged to "HIGH". Accordingly, the inversion output NWij is disabled to "LOW".

Auxilary Decoder

The main decoder of the memory device having a row redundancy scheme according to the present invention further includes a second inversion unit 1015 and a second PMOS transistor 1017. The second inversion unit 1015 inverts the logic state of the common connection line N1010. The second PMOS transistor 1017 includes a source connected to the boosted voltage VPP, a gate connected to the output N1016 of the second inversion unit N1015, and a drain connected to the common connection line.

Figure 11:
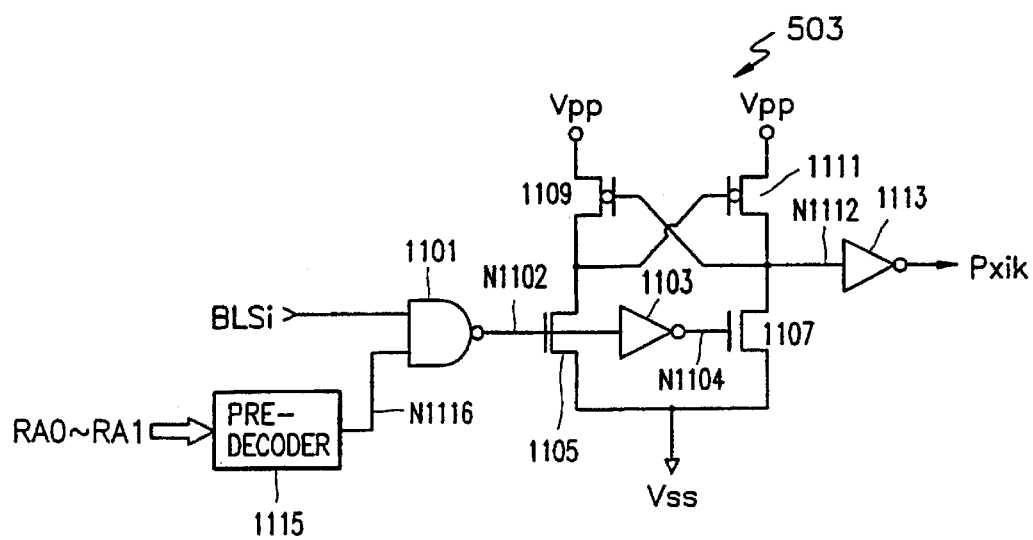
FIG. 11 is a diagram showing an auxiliary decoder of the memory device shown in FIG. 5.

Referring to FIG. 11, the auxiliary decoder 503 is enabled by a predetermined block select signal BLSi, and an output signal PXik thereof is selectively activated by row address signals RA0 and RA1.

When a corresponding global block is selected by row address signals $RA_2RA_{n-1}$ during a normal operation mode or a redundancy scheme of a that same corresponding global block is used during a redundancy mode, the block select signal BLSi is activated.

The auxiliary decoder 503 according to the present invention includes a predecoder 1115, an AND gate 1101, a first inverter 1103, a first NMOS transistor 1105, a second NMOS transistor 1107, a first PMOS transistor 1109, a second PMOS transistor 1111 and a second inverter 1113. The predecoder 1115 decodes row address signals RA0 and RA1 to generate the output N1116. The NAND gate 1101 NAND-operates the block select signal BLSi and the output N116 of the predecoder 1115. The first inverter 1103 inverts the output N1102 of the NAND gate 1101.

The first NMOS transistor 1105 includes a source connected to a ground voltage VSS and a gate connected to the output N 1104 of the first inversion unit 1103.

The first PMOS transistor 1109 includes a source connected to the boosted voltage VPP, a gate connected to a drain of the second NMOS transistor 1107, a drain commonly connected to a drain of the first NMOS transistor 1105.

The second PMOS transistor 1111 includes a source connected to the boosted voltage VPP, a gate connected to a drain of the first NMOS transistor 1105, and a drain commonly connected to the drain of the second NMOS transistor 1107, to be a common connection line N1112. The second inverter 1113 inverts a signal of the common connection line N1112 to output the auxiliary decoding signal PXik.

Accordingly, when the block select signal BLSi is logic "HIGH" and the output N1116 of the predecoder 1115 is logic "HIGH", the second NMOS transistor 1107 is turned-on, to decrease the voltage of the common connection line N1112. Accordingly, the PXik is enabled to "HIGH".

Normal Division Word Line Driver

Figure 12:
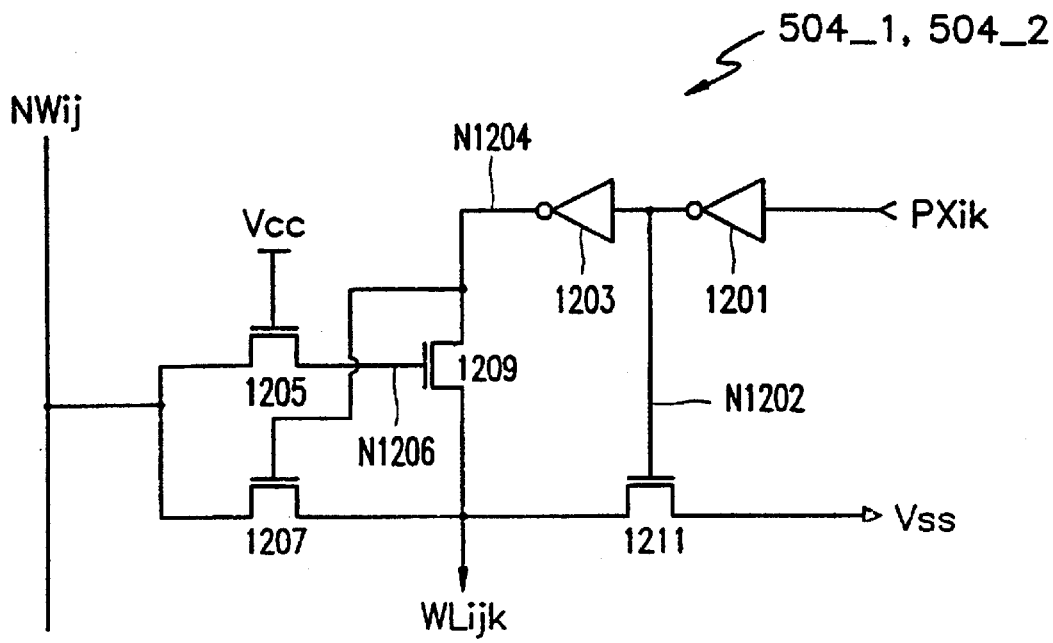
FIG. 12 is a circuit diagram showing a normal division word line driver of a memory device shown in FIG. 5.

Referring to FIG. 12, the normal division word line driver 504_1, 504_2 includes a first inversion unit 1201, a second inversion unit 1203, a first NMOS transistor 1205, a second NMOS transistor 1207, a third NMOS transistor 1209 and a fourth NMOS transistor 1211.

The first inverter 1201 inverts the auxiliary decoding signal PXik which is an output signal of the auxiliary decoder 700c. Also, the second inverter 1203 inverts the output N1202 of the first inverter 1201. At this time, the first and second inverters 1201 and 1203 drive the auxiliary decoding signal PXik which is an output signal of the auxiliary decoder 700c, and further a word line of a memory cell array of the normal block. The first NMOS transistor 1205 includes a gate connected to a power supply VCC and a first connection connected to a main decoding signal NWij which is the output of the main decoder 700b.

The second NMOS transistor 1207 includes a gate connected to the output N1204 of the second inverter 1203 and a first junction connected to the main decoding signal NWij. The third NMOS transistor 1209 includes a gate connected to a second junction N1206 of the first NMOS transistor 1205, a first junction connected to the output N1204 of the second inverter 1203, and a second junction commonly connected to the second junction of the second NMOS transistor 1207, to connect a word line WLijk of a memory cell of the normal block 507_1, 507_2, . . . .

The fourth NMOS transistor 1211 includes a source connected to a ground voltage VSS, a gate connected to the output N1202 of the first inverter 1201, and a second junction commonly connected to the second junction of the second and third NMOS transistors 1207 and 1209, to connect to a word line WLijk of the memory cell of the normal block 507_1, 507_2, . . . .

Accordingly, in the normal division word line driver, the output NWij of the main decoder 502 is enabled to VPP, the second junction N1206 of the first NMOS transistor 1205 is precharged to VCC–Vtn. At this time, Vtn indicates a threshold voltage of the first NMOS transistor 1205. When the output PXik of the auxiliary decoder 503 is enabled by "HIGH", the second junction N1206 of the first NMOS transistor 1205 is precharged to VCC–Vtn. When the output PXik of the auxiliary decoder 503 is enabled by "HIGH", the second junction N1206 of the first NMOS transistor 1205 is increased to VCC–Vtn+VPP according to a principle of self boosting. Accordingly, the third NMOS transistor 1209 is turned-on, the word line WLijk of the memory cell of the normal block 507_1, 507_2, . . . is enabled by a boosting voltage VPP. However, in the case that the output NWij of the main decoder 502 is disabled by "LOW", the word line WLijk of the memory cell of the normal block 507_1, 507_2, . . . is decreased to a ground voltage VSS according to the second NMOS transistor 1207. Also, in the case that the output PXik of the auxiliary decoder 503 is in a state of "LOW", the word line WLijk of the memory cell of the normal block 507_1, 507_2, . . . becomes a ground voltage VSS.

Redundancy Division Word Line Driver

Figure 13:
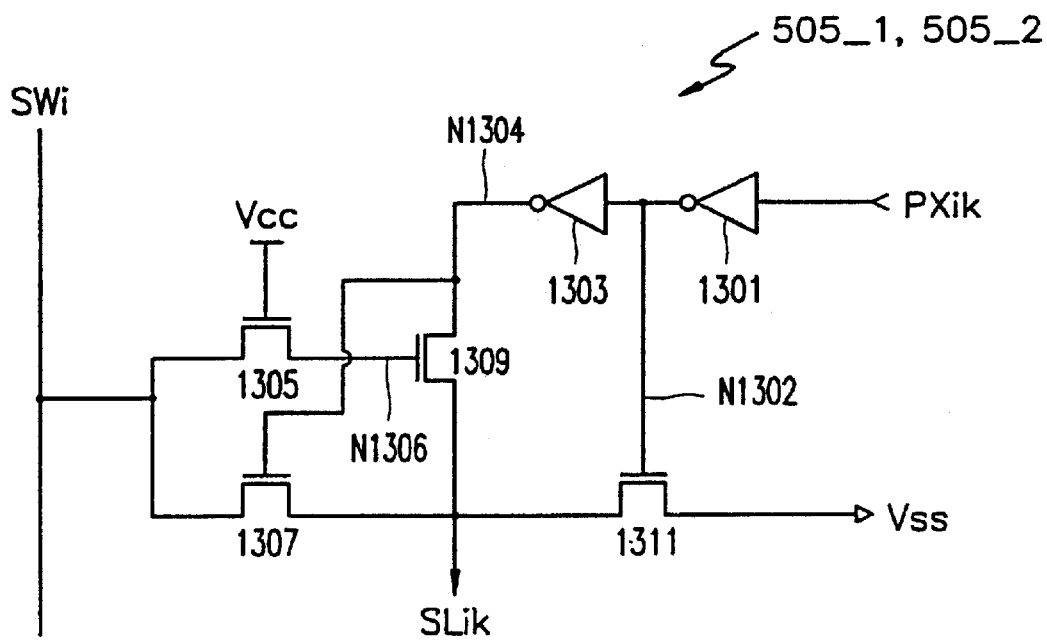
FIG. 13 is a circuit diagram showing a redundancy division word line driver of a memory device shown in FIG. 5.

Referring to FIG. 13, the redundancy division wordline driver 505_1, 505_2, . . . includes a first inverter 1301, a second inverter 1303, a first NMOS transistor 1305, a second NMOS transistor 1307, a third NMOS transistor 1309 and a fourth NMOS transistor 1311.

The first inverter 1301 inverts the auxiliary decoding signal PXik which is an output signal of the auxiliary decoder 503. Also, the second inverter 1303 inverts the output N1302 of the first inverter 1301. At this time, the first and second inverters 1301 and 1303 drive the auxiliary decoding signal PXik to drive a word line of a memory cell array of a redundancy block. Also, the first NMOS transistor 1305 includes a gate connected to a power supply VCC and a first junction connected to the output SWi of the redundancy driver 550.

The second NMOS transistor 1207 includes a gate connected to the output N1304 of the second inverter 1303 and a first junction connected to the SWi. The third NMOS transistor 1309 includes a gate connected to a second junction N1306 of the first NMOS transistor 1305, a first junction connected to the output N1304 of the second inverter 1303 and a second junction commonly connected to the second junction of the second NMOS transistor 1307, and further connected to a word line SLik of a memory cell of the redundancy block 506_1, 506_2, . . . .

The fourth NMOS transistor 1311 includes a source connected to a ground voltage VSS, a gate connected to the output N1302 of the first inverter 1301 and a second junction commonly connected to the second junction of the second and third NMOS transistors 1307 and 1309, and further connected to a word line SLik of a memory cell of the redundancy block 506_1, 506_2, . . . .

Accordingly, in the redundancy division word line driver, in the case that the SWi is enabled by VPP, a second junction N1306 of the first NMOS transistor 1305 is precharged to VCC−Vtn. At this time, Vtn indicates a threshold voltage of the first NMOS transistor 1305. Also, when the output PXik of the auxiliary decoder 700c is enabled by "HIGH", the second junction N1306 of the first NMOS transistor 1305 is increased to VCC−Vtn+VPP according to a principle of self boosting. Accordingly, the third NMOS transistor 1309 is turned-on, to enable the word line SLik of the memory cell of the redundancy block 506_1, 506_2, . . . by a boosting voltage VPP. However, in the SWi is disabled to "LOW", the word line SLik of the memory cell of the redundancy block 50 is decreased to a ground voltage VSS. Also, in the case that the output Pxik of the auxiliary decoder 503 is "LOW", the word line Slik of the memory cell of the redundancy block 506_1, 506_2, . . . goes to a ground voltage VSS.

Precharger

Figure 14:
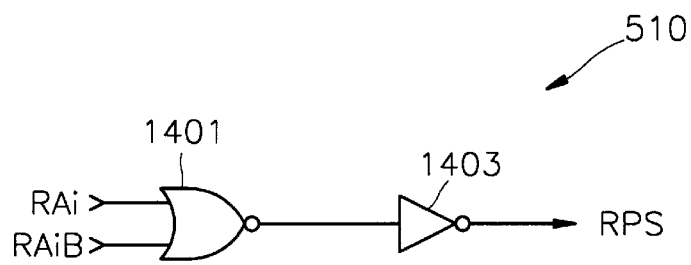
FIG. 14 is a circuit diagram showing a precharger of the memory device shown in FIG. 5.

Referring to FIG. 14, the precharger 510 includes an NOR gate 1401 and an inverter 1403.

The NOR gate 1401 receives a predetermined address signal RAi among row address signals $RA_2$~$RA_{n-1}$ and an inversion signal RAiB of the predetermined address signal, to NOR-operate. Also, the inverter 1403 inverts the output N1402 of the NOR gate 1401.

When a memory chip is reset, the RAi and the RAiB go to "LOW". Accordingly, a row precharge signal RPS which is the output of the precharger is enabled by "LOW".

Redundancy Enabling Portion

Figure 15:
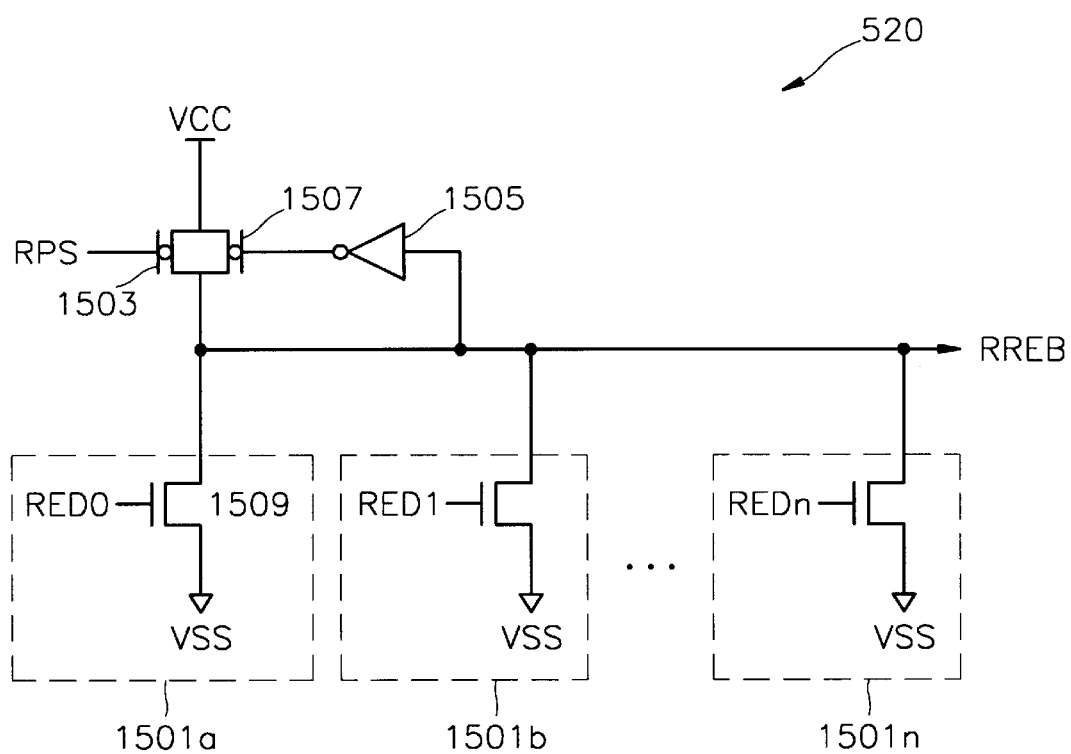
FIG. 15 is a circuit diagram showing a redundancy enabling portion of the memory device shown in FIG. 5.

Referring to FIG. 15, the redundancy enabling portion 520 includes a plurality of redundancy sensing portion 1501a, 1501b, . . . , 1501n and a first PMOS transistor 1503.

The redundancy sensing portion includes an NMOS transistor 1509 having a source connected to a ground voltage VSS, a gate connected to one of output signals RED0, RED1, . . . ,REDn−1 of a global memory cell array block and a drain connected to the row redundancy enable signal RREB.

Accordingly, a plurality of redundancy sensing portions 1501a, 1501b, . . . , 1501n respond to each of output signals RED0, RED1, . . . ,REDn−1 of the plurality of global memory cell array block, to generate the row redundancy enable signal RREB.

The first PMOS transistor 1503 includes a gate to which the row precharge signal RPS is applied, a source connected to a power supply VCC, and a drain connected to the row redundancy enable signal RREB.

Accordingly, when one fuse of the fuse boxes of the plurality of global memory cell array blocks is short, to make a redundancy signal REDi "HIGH", the RREB is enabled by "LOW".

The redundancy enable portion 520 further includes an inversion unit 1505 for inverting the row redundancy enable signal RREB and a second PMOS transistor 1507. The second PMOS transistor 1507 includes a source connected to a power supply VCC, a gate connected to the output of the inverter 1505, and a drain connected to the row redundancy enable signal RREB.

Accordingly, when the row redundancy enable signal RREB is enabled by "LOW", the inversion unit 1505 and the second PMOS transistor 1507 latch the enabled row redundancy enable signal.

Conclusion

In the above memory device having a row redundancy scheme according to the present invention, in the case that a memory cell of the redundancy block is used, fuses of other blocks except a global block including a defective cell are short. Accordingly, in the main decoder 502 including the shorted fuse, the output signal NWij is not enabled by row address decoding. However, in the case of the redundancy driver 550, a redundancy signal REDi of a corresponding address to the short fuse is enabled. Also, the auxiliary decoder 503 is also enabled by the redundancy signal REDi, to selectively enable the output signal PKik of the auxiliary decoder according to the row address signal. Accordingly, in the global block where the fuse is short, the redundancy scheme is operated.

Also, in order to prevent the main decoder 502 and redundancy driver 550 from being simultaneously enabled, fuses of the other global memory cell array block should be cut off, during curing the memory cell having a defective cell.

The main decoder 502 is decoded only by the row address signal, regardless of the logic state, i.e., enabling the block select signal BLSi.

Accordingly, a word line enable speed of the normal mode can be greatly enhanced. Also, the normal division word line drivers 504_1, 504_2, . . . can be driven by enabling the output NWij of the main decoder 502 much earlier than the output PXik of the auxiliary decoder 503. The enable time point of the wordline is determined according to the Nwij signal, so that as the NWij is enabled earlier, the wordline is enabled earlier.

According to the memory device having a row redundancy scheme of the present invention, the time for enabling the word line of a normal path in a normal operation mode is earlier, to thereby increase an operation speed of a memory chip.

Also, the redundancy effect is enhanced by using a redundancy scheme of a global block which does not include a defective cell.

It should be understood that the invention is not limited to the illustrated embodiment and that many changes and modifications can be made within the scope of the invention by a person skilled in the art.

What is claimed is:

1. A semiconductor memory device having a plurality of global blocks, a global block comprising:
   a plurality of unit matrixes including a normal block having an array of normal cells and a redundancy block having an array of redundancy cells;
   a normal division word line driver configured to drive a word line of the normal cells;
   a redundancy division word line driver configured to drive a word line of the redundancy cells;
   a main decoder configured to provide an output signal supplied to the normal division word line driver; and
   an auxiliary decoder configured to provide an output signal supplied to the normal division word line driver and the redundancy division word line driver,
   wherein the main decoder is configured to provided an output signal which is selectively activated by a row address signal regardless of use of the redundancy cells, and the auxiliary decoder is configured to provide an output signal which is selectively activated by a row address signal in the event that a corresponding global block is selected by a row address signal for selecting a global block in a normal operation mode or by a redundancy scheme of a corresponding block when a redundancy operation mode is used.

2. A semiconductor memory device according to claim 1, wherein the main decoder decodes according to a row address signal instead of a redundancy signal, to activate the output signal of the main decoder.

3. A semiconductor memory device according to claim 1, wherein the auxiliary decoder is configured to be enabled by a predetermined block select signal and has an output signal selectively activated by a row address signal, and in the event that a corresponding global block is selected by a row address signal in a normal operation mode or by a redundancy scheme of a corresponding block when a redundancy mode is used, the block select signal is activated.

4. A semiconductor memory device according to claim 1, wherein in the event that a corresponding global block is selected by a row address signal for selecting a global block and a corresponding global block is selected, the global block further includes a block selector which is configured to generate a block select signal when activated.

5. A semiconductor memory device according to claim 4, wherein the block selector comprises:
   AND means for receiving a predetermined row redundancy enable signal and a row address signal; and
   OR means for receiving a redundancy signal and the output of the AND means.

6. A semiconductor memory device according to claim 1, wherein the global block further comprises a fuse box which are configured to respond not to a row address signal for decoding the auxiliary decoder, but to a row address signal for decoding the main decoder.

7. A semiconductor memory device according to claim 6, wherein the fuse box comprises a plurality of address sensing portions which is configured to respond to each of row address signals for decoding the main decoder during a normal operation mode to deactivate a redundancy signal which is an output signal of the fuse box.

8. A semiconductor memory device according to claim 6, further comprising a redundancy enabling portion which is configured to activate a row redundancy enable signal responsive to a redundancy signal of the global block which is selectively operated, wherein each global block generates a redundancy signal.

9. A semiconductor memory device according to claim 8, wherein the redundancy enabling portion comprises a plurality of redundancy sensing portions which are each coupled to receive one of the redundancy signals which are output signals of a fuse box in each of the global blocks.

10. A semiconductor memory device according to claim 9, wherein each redundancy sensing portion comprises an MOS transistor including a source connected to a power supply, a gate connected to receive one of the redundancy signals, and a drain connected to the row redundancy enable signal.

11. A method for curing a defective cell of a semiconductor memory device having a plurality of global blocks, each global block including an auxiliary decoder, a fuse box and two or more unit matrixes, each unit matrix including a normal block and a redundancy block, and wherein the auxiliary decoder provides an output signal for controlling the normal block and the redundanicy block, the method comprising the steps of:
   selectively activating an output signal of a main decoder according to a row address signal regardless of the use of a redundancy cell of any of the redundancy blocks; and
   curing the defective cell using a fuse box of another global block where the defective cell is not included in a redundancy scheme.

12. A semiconductor memory device comprising:
   a plurality of global blocks, each global block including an auxiliary decoder, a fuse box and two or more unit matrixes, each unit matrix including a normal block and a redundancy block, wherein the auxiliary decoder provides an output signal for controlling the normal block and the redundancy block;
   means for selectively activating an output signal of a main decoder according to a row address signal regardless of the use of a redundancy cell of any of the redundancy blocks; and
   means for curing a defective cell using a fuse box of another global block where the defective cell is not included in a redundancy scheme.

13. A method of operating a semiconductor memory device having a plurality of global blocks having a plurality of unit matrixes including a normal block having an array by normal cells and a redundancy block having an array of redundancy cells, comprising the steps of:
   driving a word line of the normal cells with a normal division word line driver;
   driving a word line of the redundancy cells with a redundancy division word line driver;
   outputting an output signal from a main decoder supplied to the normal division word line driver; and
   outputting an output signal from an auxiliary decoder supplied to the normal division word line driver and the redundancy division word line driver,
   wherein the main decoder outputs an output signal which is selectively activated by a row address signal regardless of use of the redundancy cells, and the auxiliary decoder outputs an output signal which is selectively activated by a row address signal when a corresponding global block is selected by a row address signal for selecting a global block in a normal operation mode or by a redundancy scheme of a corresponding block when a redundancy operation mode is used.

14. A method as recited in claim 13, further comprising the step of:
   generating a redundancy signal with a fuse box in each global block responsive to a row address signal for decoding the main decoder in each global block.

* * * * *